(12) United States Patent
Bellman et al.

(10) Patent No.: US 8,415,555 B2
(45) Date of Patent: Apr. 9, 2013

(54) DIMENSIONAL SILICA-BASED POROUS SILICON STRUCTURES AND METHODS OF FABRICATION

(75) Inventors: Robert A. Bellman, Painted Post, NY (US); Nicholas F. Borrelli, Elmira, NY (US); David A. Deneka, Corning, NY (US); Shawn M. O'Malley, Horseheads, NY (US); Vitor M. Schneider, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 19 days.

(21) Appl. No.: 13/100,593

(22) Filed: May 4, 2011

(65) Prior Publication Data

US 2012/0052656 A1 Mar. 1, 2012

Related U.S. Application Data

(60) Provisional application No. 61/376,379, filed on Aug. 24, 2010.

(51) Int. Cl.
*H01L 31/042* (2006.01)
(52) U.S. Cl.
USPC ........... 136/255; 136/261; 257/431; 257/466; 257/E33.005; 257/E21.09
(58) Field of Classification Search .................. 136/255, 136/261
See application file for complete search history.

(56) References Cited

U.S. PATENT DOCUMENTS

| 3,757,511 A * | 9/1973 | Burgess et al. ................. 368/83 |
| 6,277,712 B1 | 8/2001 | Kang et al. ..................... 438/471 |
| 8,263,265 B2 * | 9/2012 | Mah et al. ....................... 429/236 |
| 2006/0038228 A1 * | 2/2006 | Aitken et al. ................. 257/347 |
| 2009/0056797 A1 * | 3/2009 | Barnett et al. ................. 136/255 |
| 2010/0092141 A1 * | 4/2010 | Li et al. .......................... 385/123 |

OTHER PUBLICATIONS

Richman, Erik K., et al., "Ordered Mesoporous Silicon through Magnesium Reduction of Polymer Templated Silica Thin Films," Nano Letters, vol. 8, No. 9, 3075-3079.*
T.E. Bell, et al., "Porous Silicon as a Sacrificial Material," J. Micromech. Microeng., 1996, vol. 6, p. 361-369.
B. Ceccaroli, et al., "Solar Grade Silicon Feedstock," Chapter 5, Handbook of Photovoltaic Science and Engineering, 2003, pp. 153-204.

(Continued)

*Primary Examiner* — Matthew W Such
*Assistant Examiner* — Christopher Johnson
(74) *Attorney, Agent, or Firm* — Bruce P. Watson; Dinsmore & Shohl LLP

(57) ABSTRACT

Methods of fabricating dimensional silica-based substrates or structures comprising a porous silicon layers are contemplated. According to one embodiment, oxygen is extracted from the atomic elemental composition of a silica glass substrate by reacting a metallic gas with the substrate in a heated inert atmosphere to form a metal-oxygen complex along a surface of the substrate. The metal-oxygen complex is removed from the surface of the silica glass substrate to yield a crystalline porous silicon surface portion and one or more additional layers are formed over the crystalline porous silicon surface portion of the silica glass substrate to yield a dimensional silica-based substrate or structure comprising the porous silicon layer. Embodiments are also contemplated where the substrate is glass-based, but is not necessarily a silica-based glass substrate. Additional embodiments are disclosed and claimed.

18 Claims, 2 Drawing Sheets

OTHER PUBLICATIONS

E.K. Richman, et al., "Ordered Mesoporous Silicon through Magnesium Reduction of Polymer Templated Silica Thin Films," NANO Letters, 2008, vol. 8, No. 9, pp. 3075-3079.

A. Wolf, et al., "Autodiffused Boron Emitter for N-Type Monocrystalline Si Thin-Film Solar Cells," IEEE 4th World Conference on Photovoltaic Energy Conversion, May 2006, pp. 992-995.

J.S. Culik, et al., "Silicon-Film™ Solar Cells by a Flexible Manufacturing System" Annual Subcontractor Report, Sep. 1999, pp. 1-40.

R.S. Dubey, et al., "Synthesis and Characterization of Nanocrystalline Porous Silicon Layer for Solar Cells Applications", Journal of Optoelectronic and Biomedical Materials, Mar. 2009, vol. 1, Issue I, pp. 8-14.

W. Liu, "Microstructure and crystallinity of porous silicon and epitaxial silicon layers fabricated on $p^+$ porous silicon", J. Vac. Sci. Technol. B, vol. 21, No. 1, Jan./Feb. 2003, pp. 168-173.

E. Swatsitang, et al., "Preparation and Characterization of Silicon from Rice Hulls", Journal of Metals, Materials and Minerals, 2009, vol. 19, No. 2, pp. 91-94.

T. Yonehara, et al., "ELTRAN®; SOI-Epi Wafer™ by Epitaxial Layer Transfer from Porous Si", Meeting Abstract of 2nd Int. Symp. on Pits and Pores: Formation, Properties, and Significance for Advanced Materials, The 198th Meeting of The Electrochemical Society, Abstract No. 438, 2000, p. 1.

* cited by examiner

DIMENSIONAL SILICA-BASED POROUS SILICON STRUCTURES AND METHODS OF FABRICATION

CLAIMING BENEFIT OF PRIOR FILED U.S. APPLICATION

This application claims the benefit of and priority to U.S. Provisional Application Ser. No. 61/376,379, filed on Aug. 24, 2010. The content of this document and the entire disclosure of publications, patents, and patent documents mentioned herein are incorporated by reference.

BACKGROUND

The present disclosure relates to dimensional silica-based porous silicon structures and, more particularly, to methods of fabricating the structures.

BRIEF SUMMARY

In accordance with one embodiment of the present disclosure, a method of fabricating a dimensional silica-based structure comprising a porous silicon layer is provided. According to the method, oxygen is extracted from the atomic elemental composition of a silica glass substrate by reacting a metallic gas with the substrate in a heated inert atmosphere to form a metal-oxygen complex along a surface of the substrate. The metal-oxygen complex is removed from the surface of the silica glass substrate to yield a crystalline porous silicon surface portion and one or more additional layers are formed over the crystalline porous silicon surface portion of the silica glass substrate to yield a dimensional silica-based structure comprising the porous silicon layer. Embodiments are also contemplated where the substrate is glass-based, but is not necessarily a silica-based glass substrate. Additional embodiments are disclosed and claimed.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
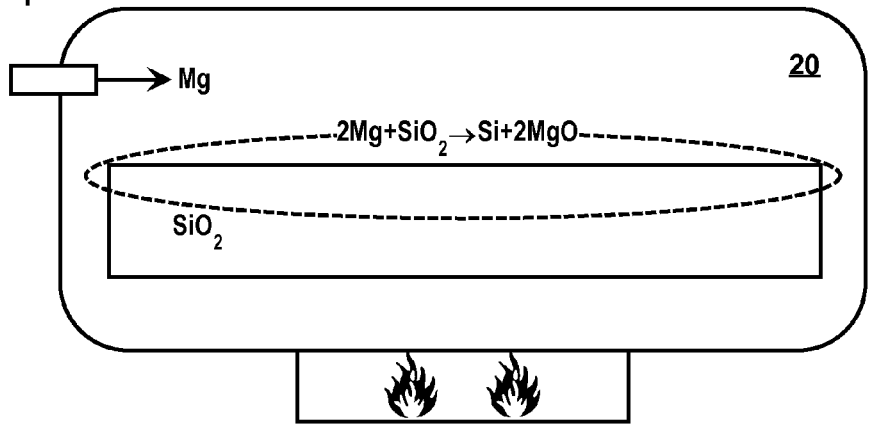
FIGS. 1-3 illustrate schematically a method of fabricating a dimensional silica-based porous silicon structure according to one embodiment of the present disclosure.
Figure 2:
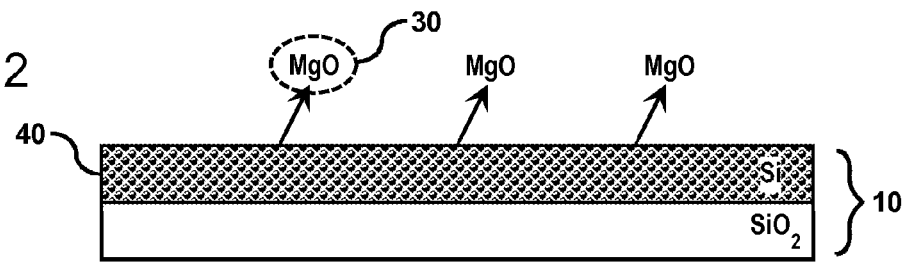
Figure 3:
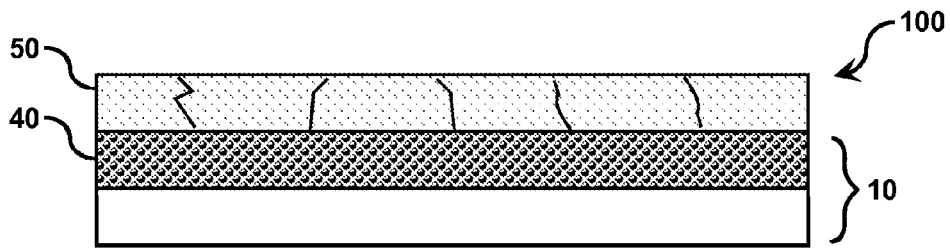

FIGS. 1-3 of the present disclosure describe the fabrication methodology of the present disclosure with reference to a silica glass substrate and a Mg-based metallo-thermic reduction process, although the scope of the present disclosure extends well beyond specific metallo-thermic reduction processes. More specifically, according to the illustrated fabrication methodology, a dimensional silica-based structure comprising a porous silicon layer can be fabricated by extracting oxygen from the atomic elemental composition of a silica glass substrate 10. The silica glass substrate 10 may be a high purity fused silica substrate, an alkaline earth alumina borosilicate glass, or any type of glass comprising silica. Oxygen is extracted from the silica glass substrate 10 by reacting a metallic gas Mg with the silica glass substrate 10 in a heated inert atmosphere 20 to form a metal-oxygen complex 30 along a surface of the silica glass substrate 10.

To facilitate the oxygen extraction, the inert atmosphere 20 is heated to a reaction temperature T, which, in the case of many silica glass substrates, will be between approximately 650° C. and approximately 750° C. For example, and not by way of limitation, for alkaline earth alumina borosilicate glass, a suitable reaction temperature T will be approximately 675° C. or slightly less and can be maintained for approximately two hours. In most cases, the silica glass substrate 10 can be characterized by a thermal strain point and the inert atmosphere 20 can be heated to a reaction temperature below the thermal strain point of the silica glass substrate 10. For example, and not by way of limitation, for glass having a strain point of about 669° C., the inert atmosphere can be heated to about 660° C. Reduced reaction temperatures are contemplated for low pressure reaction chambers.

The silica glass substrate 10 may comprise any type of silica-based glass including, but not limited to high purity fused silica, aerogel glasses, alkaline earth alumina borosilicate glasses, which may include oxides of boron, phosphorous, titanium, germanium, zirconium, vanadium, etc., and which may or may not be fabricated to be free of added arsenic, antimony, barium, and halides. For the purposes of describing and defining the present invention, it is noted that reference herein to "high purity fused silica" is intended to encompass the compositions and purity levels of high purity fused silica commonly recognized in the art. In the case of high purity fused silica, it is contemplated that the glass may be presented as a fusion drawn sheet of glass that can be a re-drawn, flexible glass sheet for silicon or silicon laminate substrates for roll-to-roll fabrication.

Although embodiments of the present disclosure are described with primary reference to silica-based glasses and the use of Mg as the metallic gas, embodiments are also contemplated where the substrate is glass-based, but is not necessarily a silica-based glass substrate. For example, it is contemplated that alternative glass substrates may be provided using non-silica glass formers such as the oxides of boron, phosphorous, titanium, germanium, zirconium, vanadium, and other metallic oxides. Further, it is contemplated that a variety of suitable reduction gases can be utilized without departing from the scope of the present disclosure. For example, and not by way of limitation, it is contemplated that the metallic reducing gas may comprise Mg, Na, Rb, or combinations thereof. In a simplified, somewhat ideal case, where the metallic gas comprises Mg, the corresponding stoichiometric reaction with the silica glass substrate is as follows:

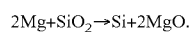

$$2Mg + SiO_2 \rightarrow Si + 2MgO.$$

Analogous reactions would characteristic for similar reducing gases.

In non-stoichiometric or more complex cases, reaction byproducts like $Mg_2Si$ are generated and the reducing step described above can be followed by the byproduct removal steps described herein. To avoid byproduct generation and the need for the byproduct removal step, it is contemplated that the stoichiometry of the reduction can be tailored such that the metallic gas is provided in an amount that is not sufficient to generate the byproduct. However, in many cases, the composition of the glass will be such that the generation of additional reaction byproducts is inevitable, in which case these additional byproducts can be removed by the etching and thermal byproduct removal steps described herein.

To enhance reduction, the substrate 10 can be subject to microwave or RF exposure while reacting the metallic gas with the silica glass substrate 10. The metallic gas can be derived from any conventional or yet to be developed source including, for example, a metal source subject to microwave, plasma or laser sublimation, an electrical current, or a plasma arc to induce metal gas formation. In cases where the metallic gas is derived from a metal source, it is contemplated that the composition of the metal source can be varied while reacting the metallic gas with the silica glass substrate to further enhance reduction.

Additional defects can be formed in the silica glass substrate by irradiating the surface of the substrate with electrons. The resulting defects enable a more facile and extensive extraction of oxygen by the metallo-thermic reducing gas agent and, as such, can be used to enhance oxygen extraction by subjecting the glass substrate to electron beam irradiation prior to the above-described metallo-thermic reduction processes. Contemplated dosages include, but are not limited to, dosages from approximately 10 kGy to approximately 75 kGy, with acceleration voltages of approximately 125 KV. Higher dosages and acceleration voltages are contemplated and deemed likely to be advantageous.

As is illustrated schematically in FIG. 2, the metal-oxygen complex 30 that is formed along the surface of the silica glass substrate 10 is removed from the surface of the silica glass substrate 10 to yield a crystalline porous silicon surface portion forming a porous silicon layer 40. Although the various embodiments of the present disclosure are not limited to a particular removal process, it is noted that the metal-oxygen complex 30 can be removed from the surface of the silica glass substrate 10 by executing a post-reaction acid etching step. For example, and not by way of limitation, post-reaction acid etching may be executed in 1M HCl solution (molar HCl:H2O:EtOH ratio=0.66:4.72:8.88) for at least 2 hours. Depending on the porosity of the glass, some additional MgO may be trapped inside the glass and additional etching may be needed for longer periods of time with multiple flushes of the acidic mixture.

As is illustrated schematically in FIG. 3, one or more additional layers 50 can be formed over the crystalline porous silicon surface portion of the silica glass substrate 10 to yield a dimensional silica-based structure 100 including the porous silicon layer 40. Typically, the additional layer 50 comprises a semiconductor or crystalline overlayer and the porous silicon layer 40 is used as a seed layer for the epitaxial growth or deposition of the overlayer. It is contemplated that the eptixially grown or deposited layer may, for example be silicon, germanium, or another semiconductor or crystalline material.

In cases where the additional layer 50 comprises a monocrystalline silicon layer, a microcrystalline silicon layer, a polycrystalline silicon layer, or an amorphous silicon layer, the method may further comprise the step of recrystallizing the additional layer 50 by annealing the layer 50 at a temperature and duration sufficient to enhance crystallization and increase grain size in the overlayer. It is contemplated that conventional annealing configurations as well as localized laser or torch annealing may be suitable. Typically, the porous silicon layer 40 will increase the degree of crystallization of the epitaxially grown or deposited silicon layer 50. In the case of polycrystalline silicon growth, the silicon that is epitaxially grown or deposited onto the porous silicon on glass template may have grain sizes from about 10 nm up to tens of microns such as >20 um. For the purposes of describing and defining the present invention, it is noted that monocrystalline silicon, also sometimes referred to as single crystal silicon, is a form in which the crystal structure is homogenous throughout the material. The orientation, lattice parameter, and electronic properties are constant throughout the material. Polycrystalline silicon is composed of many smaller silicon grains of varied crystallographic orientation. Microcrystalline silicon, sometimes also known as nanocrystalline silicon, is a form of porous silicon that is similar to amorphous silicon, in that it has an amorphous phase. However, microcrystalline silicon has small grains of crystalline silicon within the amorphous phase. This is in contrast to polycrystalline silicon which consists solely of crystalline silicon grains, separated by grain boundaries.

Figure 4:
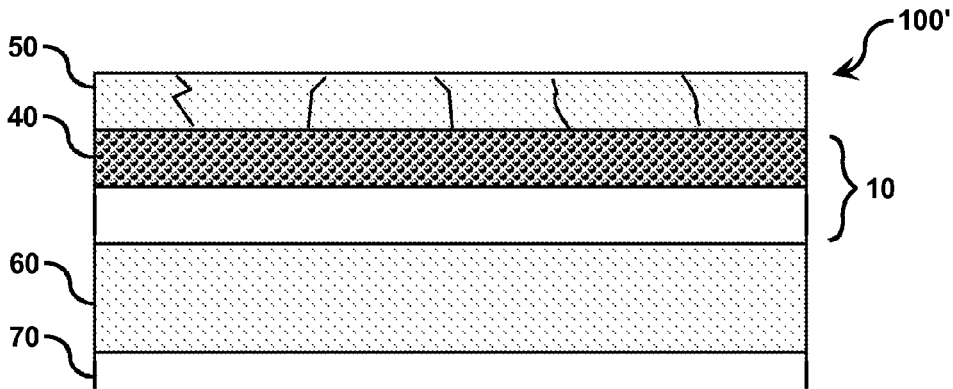
FIG. 4 illustrates a dimensional silica-based porous silicon structure according to an alternative embodiment of the present disclosure.

Referring to the dimensional silica-based structure 100' illustrated in FIG. 4, it is noted that, in many cases, the structure 100' will be formed over an underlying silica glass substrate 70 that is not high purity fused silica, i.e., a silica glass substrate including dopants, additives, or other impurities. For example, and not by way of limitation, alumina borosilicate glass substrates are the subject of widespread use in the industry. Other contemplated silica glass substrates include additives such as boron, phosphorous, titanium, germanium, zirconium, vanadium, etc. In these cases, it will often be desirable to utilize a separation layer 60 to inhibit the migration of these impurities from the underlying glass substrate 70 to remaining portions of the structure 100'. For example, the separation layer 60 may comprise a silicon nitride dielectric layer.

Figure 5:
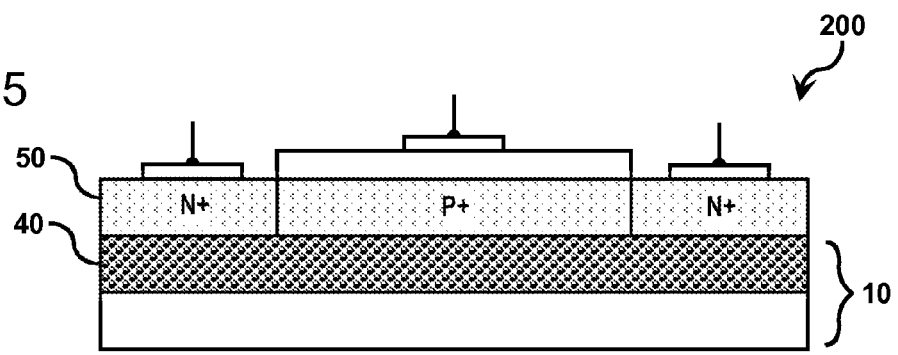
FIG. 5 illustrates schematically a silicon-on-insulator structure incorporating a silica-based porous silicon layer according to the present disclosure.
Figure 6:
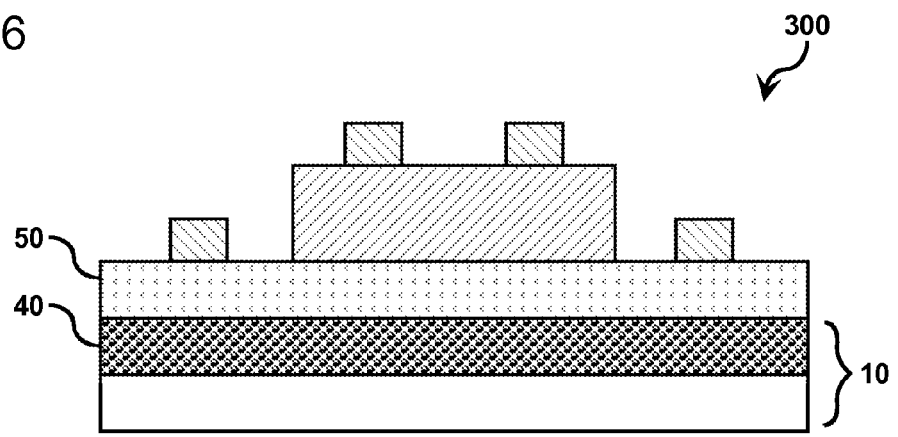
FIG. 6 illustrates schematically a photovoltaic cell incorporating a silica-based porous silicon layer according to the present disclosure.

Referring to the silicon-on-insulator thin film transistor structure 200 illustrated schematically in FIG. 5, where a variety of additional layers are arranged to form a single crystal silicon-on-insulator structure, the porous silicon layer 40 is used as a seed layer for the epitaxial fabrication of the silicon-on-insulator structure including the porous silicon layer 40. It is contemplated that dimensional silica-based structures according to the present disclosure can also be arranged to form a photovoltaic cell 300 (see FIG. 6), a thermoelectric cell, and other similar structures. It is also contemplated that dimensional silica-based structures according to the present disclosure can be arranged to form a silicon-based optoelectric device, e.g., a light emitting device, a waveguide, a photonic crystal, or a solar cell. In many of the above-noted embodiments, the structure will be formed over a silica glass substrate including significant amounts of dopants, additives or other impurities, like an alumina borosilicate glass substrate. In these and other cases, it is contemplated that a separation layer similar to that described above with reference to FIG. 4 will be incorporated in the structure.

In addition, it is contemplated that dimensional silica-based structures according to the present disclosure can be arranged to form an environmental interface device, which, for the purposes of describing and defining the present invention, is a device that is configured to alter, be altered by, or otherwise interface with an external environmental component such as air, water, an external body, etc. For example, and not by way of limitation, the environmental interface device may be a micro-reactor, filter media, or a gas sensor, in which case the porous silicon layer in the active structure of the environmental interface device would comprise a catalytic, zeolite, or other active layer of the device. Additional environmental interface devices are contemplated where the porous silicon layer is configured as a hydrophobic layer, an anti-fingerprint contact layer, or a chemically resistant or strength-enhanced surface layer.

In some embodiments of the present disclosure, the silica glass substrate is configured to comprise N-type or P-type dopants and the oxygen extraction and the metal-oxygen complex removal steps are tailored to leave significant amounts of dopants in the crystalline porous silicon surface portion of the silica glass substrate. These dopants, if present in sufficient amounts, can contribute dopants to the additional layers formed over the crystalline porous silicon surface portion of the silica glass substrate. For example, typical dopants include but are not limited to Al, P, B, and As. Alternatively, it is contemplated that N-type or P-type dopants can be introduced into the crystalline porous silicon surface portion of the silica glass substrate by conventional diffusion or ion implantation techniques.

In further embodiments of the present disclosure, it is contemplated that the silica glass substrate can be provided with a topical film for controlling the thickness, porosity or crystalline character of the resulting crystalline porous silicon surface portion of the silica glass substrate. It is contemplated that these topical films can be silicates, phosphates, or any glass former including, but not limited to, the oxides of boron, phosphorous, titanium, germanium, zirconium, vanadium, and other metallic oxides. For example, and not by way of limitation, a topical film can be formed on the glass through atomic layer deposition (ALD), chemical vapor deposition (CVD) and its variants (such as PECVD, LPCVD, APCVD), molecular beam evaporation (MBE), sputter deposition, etc. It is also contemplated that the surface of the silica glass substrate may be provided with grooves, raised features or other texturing to yield specific optical or combined optoelectronic properties, such as optical scattering. It is further contemplated that the starting substrate glass composition may be tailored to enhance thermal processing capabilities, e.g., JADE™ glass contains barium and is stable up to 725° C. In addition, it is contemplated that the glass composition may be chosen to enhance optical transparency, polarizability, or shock resistance.

In still further embodiments of the present disclosure, it is contemplated that dimensional silica-based structures can be densified by coating the crystalline porous silicon surface portion of the silica glass substrate with an additional glass or metal oxide layer and reacting a metallic gas with the crystalline porous surface portion of the glass substrate at the reaction temperature to yield a densified oxygen substrate. This process can be repeated a plurality of times with relatively thin, e.g., 10 nm to 300 nm, glass or metal oxide layers, under the various metallo-thermic reaction conditions described herein.

One or more inert blocking layers can be provided over the silica glass substrate, prior to reacting the metallic gas with the silica glass substrate, to facilitate overlayer patterning. For example, and not by way of limitation, a graphite blocking layer could be used in a patterning step. It is also contemplated that fabrication methods according to the present disclosure could incorporate a reducing agent doping step where the silica glass substrate is pre-treated with a gaseous reducing agent to infiltrate the surface of the silica glass substrate with the reducing agent and enhance the reaction of the metallic gas and the silica glass substrate. For example, the silica glass substrate may be exposed to pressurized hydrogen and an inert carrier gas in a Parr vessel for quicker and more complete topical reduction.

Fabrication methods according to the present disclosure could also incorporate a post-reaction acid etching step for the removal of amorphous silicon from the porous silicon, e.g., by HF etching or other conventional or yet-to-be developed acid etching protocols. It is contemplated that the post-reaction acid etching step will, in many cases, yield crystalline porous silicon characterized by X-ray diffraction spectra dominated by a preferential <111> crystalline orientation.

Fabrication methods according to the present disclosure could further incorporate one or more post-reaction thermal treatment steps. For example, and not by way of limitation, substrates including porous silicon layers according to the present disclosure can be treated in an inert atmosphere at a post-reaction temperature exceeding the reaction temperature. More specifically, a substrate processed for 2 hours at 675° C. and etched in 1M HCL for 2 hours can be subject to post-reaction thermal treatment in Ar for 6 hours at 725° C. In most cases, where the inert atmosphere is heated to a reaction temperature between approximately 650° C. and approximately 750° C., the post-reaction temperature will be above 700° C., e.g., between 725° C. and 750° C., and will be maintained for several hours. In the case of high purity fused silica, the post-reaction treatment is typically maintained for approximately 6 hours for complete removal of $Mg_2Si$. For alkaline earth alumina borosilicate glasses, which may be fabricated to be free of added arsenic, antimony, barium, and halides, post-reaction treatment is typically maintained for more than approximately 18 hours and can be executed intermittently at intermediate 6 hour treatment steps. In cases where the reaction of the metallic gas with the silica glass substrate additionally forms a metal-non-oxygen complex along a surface of the silica glass substrate, the post reaction thermal treatment can be maintained for a period of time that is sufficient to evaporate the metal-non-oxygen complex as well.

For the purposes of describing and defining the present invention, it is noted that a "dimensional" substrate or a "dimensional" structure is one where the dimensions of the substrate or structure have a predefined utilitarian shape and size, i.e., a shape and size designed for a particular utility. Dimensional substrates and structures may be fully functional structures, intermediate structures, partially functional structures, precursor substrates or structures, or seed substrates or structures for the formation of intermediate, partially or fully functional structures. Dimensional substrates and structures can, for example, be distinguished from powders, grains, or other types of coarse or fine particulate matter of undefined, pseudo-random, or otherwise indeterminate shape. Dimensional substrates and structures can also be distinguished from nanostructures or nanoparticles. Examples of dimensional substrates and structures include, but are not limited to seed substrates or sheet layers for structure growth, thin film transistors, photovoltaic cells, thermoelectric cells, light emitting devices, waveguides, photonic crystals, solar cells, and other similar structures. In addition, it is noted that porous silicon is a form of the chemical element silicon having a distribution of nanoscale sized voids in its microstructure, rendering a relatively large surface to volume ratio, in some cases greater than 500 $m^2/g$. It is also noted that recitations herein of "at least one" component, element, etc., should not be used to create an inference that the alternative use of the articles "a" or "an" should be limited to a single component, element, etc.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the term "approximately" is utilized herein to represent the inherent degree of uncertainty that may be attributed to any quantitative comparison, value, measurement, or other representation. The term "substantially" is also utilized to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

What is claimed is:

1. A method of fabricating a dimensional silica-based substrate or structure comprising a porous silicon layer, the method comprising:
    providing a silica glass substrate;
    extracting oxygen from the atomic elemental composition of the silica glass substrate by reacting a metallic gas with the silica glass substrate in a heated inert atmosphere to form a metal-oxygen complex along a surface of the silica glass substrate, wherein the inert atmosphere is heated to a reaction temperature sufficient to facilitate the oxygen extraction;
    removing the metal-oxygen complex from the surface of the silica glass substrate to yield a crystalline porous silicon surface portion of the silica glass substrate;
    forming one or more additional layers over the crystalline porous silicon surface portion of the silica glass substrate to yield a dimensional silica-based substrate or structure comprising the porous silicon layer; and
    densifying the dimensional silica-based structure by coating the crystalline porous silicon surface portion of the silica glass substrate with an additional glass or metal oxide layer and reacting a metallic gas with the crystalline porous surface portion of the glass substrate at the reaction temperature to yield a densified oxygen substrate.

2. A method as claimed in claim 1 wherein:
    the dimensional silica-based substrate or structure comprises an overlayer comprising a semiconductor or crystalline material; and
    the method further comprises utilizing the porous silicon layer as a seed layer for the epitaxial growth or deposition of the overlayer.

3. A method as claimed in claim 2 wherein:
    the overlayer comprises a monocrystalline silicon layer, a microcrystalline silicon layer, a polycrystalline silicon layer, or an amorphous silicon layer; and
    the method further comprises the step of recrystallizing the overlayer by annealing the overlayer at a temperature and duration sufficient to enhance crystallization and increase grain size in the overlayer.

4. A method as claimed in claim 1:
    further comprises further comprising utilizing the porous silicon layer as a seed layer for the epitaxial fabrication of a silicon-on-insulator structure.

5. A method as claimed in claim 4 wherein the silica glass substrate including the porous silicon layer is formed over an underlying silica glass substrate and an intervening separation layer configured to inhibit migration of impurities from the silica glass substrate to remaining portions of the structure.

6. A method as claimed in claim 1 wherein:
    the silica glass substrate comprises N-type or P-type dopants; and
    the oxygen extraction and the metal-oxygen complex removal steps are tailored to leave significant amount of dopants in the crystalline porous silicon surface portion of the silica glass substrate.

7. A method as claimed in claim 1 wherein the silica glass substrate is provided with a topical film for controlling the thickness, porosity or crystalline character of the resulting crystalline porous silicon surface portion of the silica glass substrate.

8. A method as claimed in claim 1 wherein the method comprises a patterning step where one or more inert blocking layers are provided over the silica glass substrate prior to reacting the metallic gas with the silica glass substrate.

9. A method of fabricating a dimensional silica-based substrate or structure comprising a porous silicon layer, the method comprising:
    providing a silica glass substrate;
    extracting oxygen from the atomic elemental composition of the silica glass substrate by reacting a metallic gas with the silica glass substrate in a heated inert atmosphere to form a metal-oxygen complex along a surface of the silica glass substrate, wherein the inert atmosphere is heated to a reaction temperature sufficient to facilitate the oxygen extraction;
    removing the metal-oxygen complex from the surface of the silica glass substrate to yield a crystalline porous silicon surface portion of the silica glass substrate;
    forming one or more additional layers over the crystalline porous silicon surface portion of the silica glass substrate to yield a dimensional silica-based substrate or structure comprising the porous silicon layer; and
    wherein the method comprises a reducing agent doping step where the silica glass substrate is pre-treated with a gaseous reducing agent to infiltrate the surface of the silica glass substrate with the reducing agent and enhance the reaction of the metallic gas and the silica glass substrate.

10. A method as claimed in claim 1 wherein the silica glass substrate is characterized by a thermal strain point and the inert atmosphere is heated to a reaction temperature below the thermal strain point of the silica glass substrate.

11. A method as claimed in claim 1 wherein the metallic gas comprises Mg and a reaction with the silica glass substrate comprises:

$$2Mg+SiO_2 \rightarrow Si+2MgO.$$

12. A method as claimed in claim 1 wherein the metallic gas is provided in an amount that is sufficient for stoichiometric reaction conditions.

13. A method as claimed in claim 1 wherein a reaction of the metallic gas with the silica glass substrate generates reaction byproducts and the method comprises one or more byproduct removal steps.

14. A method of fabricating a dimensional silica-based substrate or structure comprising a porous silicon layer, the method comprising:
   providing a silica glass substrate;
   extracting oxygen from the atomic elemental composition of the silica glass substrate by reacting a metallic gas with the silica glass substrate in a heated inert atmosphere to form a metal-oxygen complex along a surface of the silica glass substrate, wherein the inert atmosphere is heated to a reaction temperature sufficient to facilitate the oxygen extraction;
   removing the metal-oxygen complex from the surface of the silica glass substrate to yield a crystalline porous silicon surface portion of the silica glass substrate;
   forming one or more additional layers over the crystalline porous silicon surface portion of the silica glass substrate to yield a dimensional silica-based substrate or structure comprising the porous silicon layer; and
   wherein the substrate is subject to microwave or RF exposure while reacting the metallic gas with the silica glass substrate.

15. A method of fabricating a dimensional silica-based substrate or structure comprising a porous silicon layer, the method comprising:
   providing a silica glass substrate;
   extracting oxygen from the atomic elemental composition of the silica glass substrate by reacting a metallic gas with the silica glass substrate in a heated inert atmosphere to form a metal-oxygen complex along a surface of the silica glass substrate, wherein the inert atmosphere is heated to a reaction temperature sufficient to facilitate the oxygen extraction;
   removing the metal-oxygen complex from the surface of the silica glass substrate to yield a crystalline porous silicon surface portion of the silica glass substrate;
   forming one or more additional layers over the crystalline porous silicon surface portion of the silica glass substrate to yield a dimensional silica-based substrate or structure comprising the porous silicon layer; and
   wherein the silica glass substrate is subject to electron beam irradiation prior to reacting the metallic gas with the silica glass substrate in the heated inert atmosphere.

16. A method as claimed in claim 1 wherein:
   the reaction of the metallic gas with the silica glass substrate additionally forms a metal-non-oxygen complex along a surface of the silica glass substrate; and
   the method further comprises a post-reaction thermal treatment that is maintained in an inert atmosphere at a post-reaction temperature exceeding the reaction temperature for a period of time that is sufficient to evaporate the metal-non-oxygen complex.

17. A method as claimed in claim 1 wherein the method further comprises a post-reaction acid etching step for removing the metal-oxygen complex or amorphous silicon.

18. A method as claimed in claim 1 wherein the dimensional silica-based structure comprises an overlayer comprising a semiconductor or crystalline material, the method further comprising:
   removing the metal-oxygen complex from the surface of the silica glass substrate through post-reaction acid etching to yield a crystalline porous silicon surface portion of the silica glass substrate;
   executing post-reaction thermal treatment of the substrate in an inert atmosphere at a post-reaction temperature exceeding the reaction temperature; and
   forming the overlayer over the crystalline porous silicon surface portion of the silica glass substrate by utilizing the porous silicon layer as a seed layer for the epitaxial growth or deposition of the overlayer to yield a dimensional silica-based structure comprising the porous silicon layer.

\* \* \* \* \*